United States Patent [19]

Blackman et al.

[11] 4,037,311
[45] July 26, 1977

[54] METHODS OF MANUFACTURING INFRA-RED DETECTOR ELEMENTS

[75] Inventors: Morris V. Blackman; Michael D. Jenner, both of Southampton, England

[73] Assignee: U.S. Philips Corporation, New York, N.Y.

[21] Appl. No.: 704,999

[22] Filed: July 14, 1976

[51] Int. Cl.² .......................................... H01L 31/18
[52] U.S. Cl. ...................................... 29/593; 29/572; 29/578; 29/583; 29/592
[58] Field of Search ................. 29/592, 593, 573, 574, 29/578, 583, 412, 413, 414, 572

[56] References Cited

U.S. PATENT DOCUMENTS

| | | | |
|---|---|---|---|
| 3,673,063 | 6/1972 | Wakefield | 29/583 X |
| 3,795,045 | 3/1974 | Dumas | 29/574 |
| 3,988,774 | 10/1976 | Cohen-Solal | 29/572 X |

FOREIGN PATENT DOCUMENTS

| | | | |
|---|---|---|---|
| 998,749 | 7/1965 | United Kingdom | 29/583 |

OTHER PUBLICATIONS

"A Method for Testing and Bonding Beam-Lead Devices", by P. Mallery, at Electronic Components Conference, Washington, D.C., May 1970.

*Primary Examiner*—Victor A. DiPalma
*Attorney, Agent, or Firm*—Frank R. Trifari; Carl P. Steinhauser

[57] ABSTRACT

A method of forming in a wafer of infra-red sensitive material a large plurality of infra-red detector elements each comprising a body having a rectangular surface configuration with a pair of low resistance contacts extending on oppositely located curved edges of the body at opposite sides of a sensitive area of the body. A wafer of the infra-red sensitive material is adhered to a supporting body and by a combination of masking, etching and polishing techniques a plurality of elemental body portions of reduced thickness are defined in the wafer having oppositely located curved edges. Thereafter, electrically conductive material is deposited to form the contacts on the surface of each elemental body portion, and finally the elemental body portions and applied contacts are removed from the supporting body.

15 Claims, 21 Drawing Figures

METHODS OF MANUFACTURING INFRA-RED DETECTOR ELEMENTS

This invention relates to methods of manufacturing a plurality of infra-red detector elements.

The manufacture of infra-red detector devices comprises the formation of infra-red detector elements, the mounting of the elements on suitable substrates, the application of electrical connections to the elements, the testing of the elements provided with said connections and the eventual final encapsulation of the elements and applied contacts in a suitable envelope. Infra-red detector devices in some forms comprise only a single infra-red detector element and in other forms comprise a plurality of infra-red detector elements, for example arranged as a linear array. For devices in which the operation is dependent upon the intrinsic photoconductivity of the infra-red sensitive material the manufacture of the elements comprises steps such as material preparation, element definition by a combination of etching and polishing techniques, surface treatments and application of contact layers. For some infra-red detector devices the infra-red sensitive material employed, for example cadmium mercury telluride, is difficult to prepare and costly. Therefore, any steps that can be taken in element manufacture which lead to economies in the use of such material are significant. However, the problem arises that there may exist a wide variety of requirements for different element sizes and characteristics and mounting configurations depending upon the particular infra-red detector device to be manufactured, for example the size of the sensitive area of the elements may be as small as 25 microns × 25 microns and as large as 2 mm × 2 mm. When forming the element or elements from a slice of the infra-red sensitive material it is thus costly if for each different configuration a fresh slice of such material has to be used as the starting body. For the manufacture of the devices comprising an array of infra-red detector elements the further problem of yield occurs when, as is customary, the array comprises the arrangement of the detector elements in one or more groups each formed in a common body of the infra-red sensitive material. This so-called 'monolithic' approach to the fabrication of a group of detector elements gives rise to many problems. Thus where, for example, a group of ten elements are formed in a single comb-shaped body the problem arises that if after mounting and application of electrical connections one of the individual elements of a group is found to be faulty on testing then the whole group has to be replaced. Other problems arise in the so-called monolithic approach, particularly in connection with the spacing of the individual elements in a group formed in a common body. Where the separation of the active surface areas of the elements in such a body is defined by an etching process there exists a limitation for the minimum separation that can be achieved because in general when etching the body of infra-red sensitive material the width of a channel will normally be considerably in excess of the thickness of the body. Even if the thickness of the body is reduced to 6 microns it is not readily possible by etching to achieve a separation of individual elements of less than 12 microns. Furthermore if the processing is such that the individual elements are defined before the final reduction in thickness the handling and further processing of bodies of such small thickness may be extremely difficult.

Another problem which arises, both in single element devices and in arrays, is the provision of electrical connections to the or each individual infra-red detector element. Hitherto this has been effected by joining wire leads onto metallized surface portions of the element or elements, for example, by a thermocompression bonding process or a soldering process. Due to the deformation of the wire end that is associated with the bonding operation, for example as occurs in nail-head bonding, steps have to be taken to ensure that the area of the part of the element to which the wire is bonded is sufficient to accommodate the finally deformed wire end in such manner that said deformed wire end lies entirely on the element. This can unduly complicate the element design and place further limitations on the achievable minimum separation between adjoining elements in an array. Also problems occur when joining the other ends of the wire leads, for example by soldering, to lead-out conductors.

Another problem associated with the so-called monolithic approach to element fabrication arises when it is desired to produce multi-element detector devices in which the separation of the elements, for example in a linear array, is not uniform. This non-uniformity of spacing may be desired, for example, when different degrees of resolution are required at different parts of the array of detector elements. The formation of a plurality of elements in a single body with different spacing between elements at different parts of the array gives rise to many difficulties and can be extremely costly in terms of the material required.

According to the invention there is provided a method of manufacturing a plurality of infra-red detector elements each comprising a body of infra-red sensitive material having a substantially rectangular surface configuration with a pair of low resistance electrical contacts spaced apart on one surface of the body at opposite sides of a sensitive area of the element, wherein a wafer of the infra-red sensitive material is adhered to a supporting body, a first plurality of substantially parallel extending channels are formed extending in the wafer material to define on the supporting body a plurality of substantially parallel strip portions of the infra-red sensitive material, a treatment to obtain a reduction in the thickness of the strip portions is effected and to obtain a curvature of the exposed longitudinal edges of the strip portions, a second plurality of substantially parallel extending channels are formed in the wafer material of the strip portions in a direction substantially normal to the longitudinal direction of the strip portions to define on the supporting body an array of rectangular elemental body portions of the infra-red sensitive material each having curved edges on two opposite sides, electrically conductive material is deposited to form on the surface of each elemental body portion a pair of electrical contact layers which are spaced apart and adjoin the oppositely located curved edges, and the elemental body portions with applied contact layers are removed from the supporting body.

This method can provide significant advantages in terms of material savings, flexibility of providing elements of different sensitive areas, enhanced detector performance, small separation of elements in multi-element devices, and provision of external electrical connections as will be described hereinafter. The method provides the elements in individual form rather than as a monolithic assembly and in such manner that their further assembly and contacting in the manufacture of an infra-red detector device is readily facilitated in a desirable manner. In particular the provision of the elements with applied contact layers adjoining the oppositely located curved edges enables the further assembly of the elements either in single element devices or in multi-element devices to be effected with the electrical connections applied thereto by way of deposited conductive layers. This obviates the necessity of using wire bonding or soldering with the previously mentioned attendant disadvantages. In respect of this method of assembly and contacting reference is invited to our co-pending patent application Ser. No. 705,078, filed July 14, 1976. The assembly of the individual elements on a substrate may be, for example by means of adhering the elements to an insulating substrate with an epoxy resin. Such a method may be used both for single element devices and multi-element devices. In respect of the latter the considerable advantage arises that the spacing of the elements may be obtained as desired. The spacing may be considerably smaller than is obtained in monolithically formed multi-element devices and furthermore, for example in a linear array, the pitch distances between the elements may be varied as is desired. Furthermore the formation, if desired, of two-dimensional arrays with any desired spacing is readily facilitated.

The method in accordance with the invention for forming the elements enables considerable materials savings to be made because in any one wafer which is processed it is readily possible to provide elements of different sensitive areas, for example by appropriate choice of the separation of the second plurality of channels. Furthermore, enhanced element performance may be achieved because various surface treatments can be readily accommodated in the method.

Prior to adhering the wafer or infra-red sensitive material to the supporting body the wafer may be subjected to an oxidizing treatment to form an oxide on the surface of the wafer which is to be adhered to the supporting body. In this manner the surface of the subsequently formed infra-red sensitive elements situated opposite the surface at which in operation the radiation is incident will be provided with a layer which is found to enhance the performance of the detector elements.

After adhering the wafer of infra-red sensitive material to the supporting body and prior to forming the first plurality of channels in the wafer material the wafer may be subjected to an initial thickness reduction process via the surface thereof remote from the supporting body. This thickness reduction may be effected by multi-stage polishing process, with progressively less damage being produced in successive stages, for example by varying the size of the abrasive particles used in successive stages and also correspondingly varying the hardness of a base lap used in the process until the desired thickness is obtained.

The treatment to obtain a reduction in thickness of the strip portions and to obtain a curvature of the exposed longitudinal edges of the strip portions may comprise the combination of a polishing process followed by an etching process.

Subsequent to forming the second plurality of channels in the wafer material exposed surface parts of the elemental body portions may be subjected to a passivating treatment. The carrying out of the passivating treatment at this stage of the processing, that is subsequent to defining the array of substantially rectangular elemental body portions, is advantageous because it enables exposed side surfaces of the elemental body portions, which in the finally produced element will adjoin the main sensitive area surface parts, to be subjected to the passivating treatment. This is desirable because in a device produced without the passivated side surfaces there could occur a degradation in performance when the device is subjected to elevated temperatures. In a preferred form immediately prior to the passivating treatment the exposed surface parts of the elemental body portions are subjected to an etching treatment.

The passivating treatment may be confined to central surface areas of the elemental body portions which extend across said elemental body portions, said areas being defined by masking layer portions present on opposite sides of said areas adjacent the curved edges of the elemental body portions. The masking layer portions may be photoresist.

Subsequent to the passivating treatment and prior to applying the contact layers the said masking layer portions may be removed and a further masking layer applied and defined so that each passivating surface area is covered by a masking layer portion with the exception of a pair of oppositely located peripheral strip parts thereof extending substantially parallel to the curved edges of the elemental body portions, a material removal treatment being effected at the exposed strip parts of the passivated surface areas in the presence of the masking layer portions. In this manner the oxidized surface areas are slightly reduced in their lateral extent prior to applying the contact layers in order to avoid problems of mask alignment when applying the contact layers.

The said material removal treatment to reduce the lateral extent of the passivated surface areas may be effected by a polishing process, for example with a lapping cloth and a very fine abrasive.

The further masking layer may be of photoresist and the electrical contact layers formed by deposition of the electrically conductive material of the exposed surface parts of the elemental body portions and the photoresist masking layer surface parts followed by the chemical removal of the photoresist masking layer and the electrically conductive material deposited thereon. In this manner the deposited conductive material is removed from above the active surface areas of the elements by a so-called 'lift-off' technique. The use of such a technique is advantageous compared with one in which the conductive material is first deposited over the entire surface and then defined photolithographically, particularly when the deposited conductive material is of gold, because it may not be possible to etch the conductive material without removing the underlying passivating layer and possibly the material of the elemental body portions.

Subsequent to the application of the contact layers the elemental body portions may be removed from the supporting body individually by mechanical means, for example by lifting with a fine tool.

When using mechanical means for the removal, the elemental body portions may be removed from selected positions of the array and subjected to testing procedures, for example to measure the resistivity, responsitivity, cut-off wavelength, time constant and $D^x$, in order to evaluate the characteristics of the elemental body portions and their distribution in the array. In this manner a form of map of the characteristics of the elemental body portions can be obtained and thereafter the elemental body portions can be selected for removal in accordance with the desired characteristics of the detector devices to be manufactured. Such a form of testing is advantageously employed when the properties of the original starting wafer are not constant over all parts of the wafer.

For the manufacture of a multi-element infra-red detector device a group of adjacently situated elemental body portions in the array on the supporting body may be selected for removal in accordance with the evaluated characteristics of the elemental body portions removed for the testing purposes.

At least the first plurality of substantially parallel extending channels may be formed in the wafer with a uniform spacing. In this manner all the elemental body portions subsequently produced will have the same cross-dimension in a direction between the curved edges at two opposite sides. By varying the spacing of the said second plurality of the channels which are formed in the previously defined strips of the infra-red sensitive material the width of the elemental body portions, that is the cross-dimension in the direction parallel to the curved edges at two opposite sides, may be varied. In this manner in any one starting wafer there may be formed a plurality of elemental body portions of at least two different sizes of the active surface areas.

The method in accordance with the invention may be employed in the production of infra-red detector elements of various materials, particularly high cost materials. One such material is cadmium mercury telluride where the material preparation of desired characteristics is time consuming and calls for economies wherever possible in element formation. Nevertheless the method may also be advantageously employed in the production of infra-red detector elements in other materials where the cost savings on materials are not quite so relevant, for example in indium antimonide.

An embodiment of the invention will now be described, by way of example, with reference to the accompanying diagrammatic drawings, in which.

The Figures in the accompanying drawings are not to scale and consequently the relative dimensional proportions are totally distorted, particularly in a practical embodiment the thickness of the various layers in relation to their lateral extend will be much smaller than may otherwise be apparent from the drawings.

The embodiment now to be described comprises the manufacture of a large plurality of, in the range of two thousand, infra-red detector elements of cadmium mercury telluride. In this embodiment the material composition, that is the atomic ratio of cadmium to mercury, is such as to produce a cut-off wavelength in the region of 12 microns.

The starting material is a disc-shaped wafer of the cadmium mercury telluride of approximately 10 mm diameter and 0.5 mm thickness.

The wafer 1 is mounted on a ceramic polishing block 2 with a layer of wax 3. The polishing block has raised shoulders of 200 microns height. Polishing of the surface of the wafer projecting beyond the shoulders is effected by a rotary machine using a base lap and an abrasive slurry. The polishing is a multi-stage process with progressively less damage being produced in the crystal structure as the thickness is reduced to the desired value of 200 microns. This progressive reduction in damage is achieved by the use of progressively finer abrasive particles and base laps. This polishing is continued until the surface of the wafer lies flush with the surfaces of the shoulders of the polishing block 2. To remove the remainder of the surface damage and etching treatment is effected with an etchant comprising bromine in methanol.

A passivating treatment is then effected with the wafer 1 still remaining adhered to the polishing block 2 so that treatment is effected on the exposed upper and side surfaces.

Figure 1:
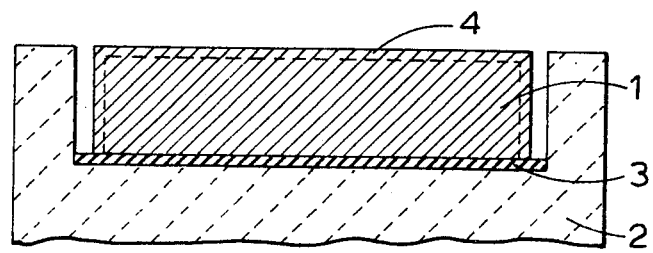
FIG. 1 is a cross-sectional view of a wafer of cadmium mercury telluride mounted on a polishing block and at a stage in the manufacture after effecting a surface treatment.

FIG. 1 shows the wafer 1 of 200 microns thickness having an oxide surface layer 4.

The wafer 1 is now removed from the polishing block 2 and is adhered via the oxidised major surface to a further polishing block 5 of high density alumina. The supporting body formed by the polishing block 5 has outer shoulders of 25 microns in height and within the shoulders the surface has a layer 6 of tantalum thereon. The wafer 1 is adhered to the tantalum layer 6 with a layer of wax 7.

Figure 2:
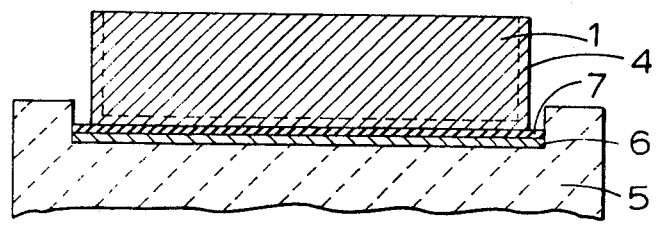
FIG. 2 shows in cross-section the wafer after mounting on a further polishing block.
Figure 3:
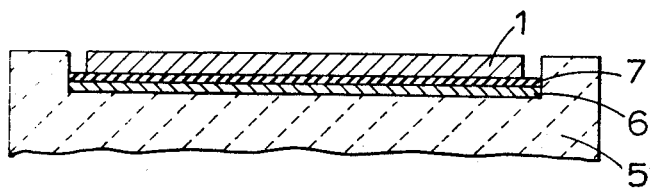
FIG. 3 shows in cross-section the residual wafer on the further polishing block after a thickness reduction step.

Although the previously formed oxide surface layer 4 is shown in FIG. 2 in the following Figures it is omitted for the sake of convenience of illustration. A multi-stage polishing operation is effected with a rotary lapping machine using an alumina slurry, the particle size and base laps being chosen such that the damage produced is progressively reduced in successive stages. This polishing is effected until the polished surface of the wafer 1 is substantially co-planar with the raised shoulders of the polishing block 5. FIG. 3 shows the wafer 1 after this thickness reduction step, the wafer 1 now having a thickness of approximately 25 microns.

Figure 4:
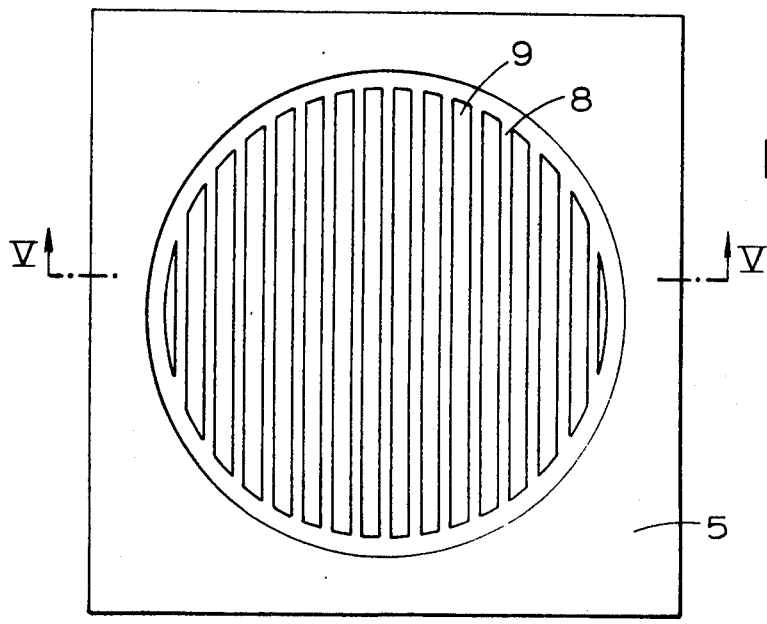
FIGS. 4 and 5 show in plan view and cross-section respectively the wafer on the further polishing block after a further step in the processing, FIG. 5 being a section on the line V—V in FIG. 4.
Figure 5:
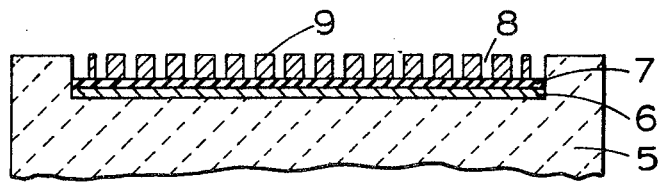

With the wafer 1 of reduced thickness still adhered via the wax layer 7 to the tantalum layer 6 on the polishing block 5 a layer of photoresist is applied on the upper surface of the wafer 1. A photomasking and developing process is then effected to define a plurality of substantially parallel strip-shaped openings in the photoresist layer. An etching treatment is then effected using a suitable etchant for cadmium mercury telluride to form in the wafer a first plurality of substantially parallel extending channels 8 which define on the polishing block a plurality of substantially parallel extending strip portions 9 of cadmium mecury telluride. FIGS. 4 and 5 show the channels 8 and the strips 9. In this example the channels 8 are of approximately 50 microns in width and the strips are all of approximately 200 microns in width.

The next stage in the processing is the removal of the parts of the photoresist layer remaining on the strip portions 9. Thereafter a thickness reduction is effected in order to reduce the thickness of the strip portions 9 to approximately 8 microns and at the same time effect a curvature of the exposed upper longitudinal edges of the strip portions 9. This is effected by first polishing with a lapping machine using a fine grade pad and a fine abrasive until the residual thickness of the strip portions 9 is approximately 12 microns and thereafter etching the strip portions 9 to remove material of a thickness in the region of 4 to 5 microns.

Figure 6:
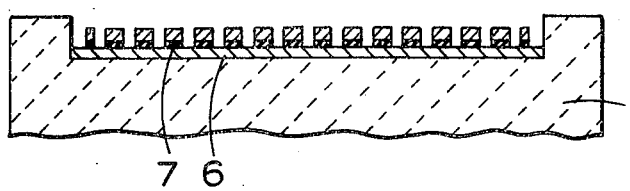
FIG. 6 shows in cross-section the wafer on the further polishing block after a further thickness reduction step.

In this manner the upper longitudinal edges of the strip portions are rounded and this effect is utilised in order to enable the external contacting of the elements when finally produced. Furthermore the etching is found to have a sensitising effect which yields an enhanced detector performance. FIG. 6 shows in cross-section the strip portions 9 after the etching process. Due to the distortion of the relative dimensions in the drawing the rounding of the longitudinal edges does not appear to be significant but in practice it is found that the curvature extends in the cross-section over a distance of at least 15 microns from the bottom surface at each longitudinal edge. It is also noted that during the polishing to effect the said reduction in thickness from 12 microns to 7 to 8 microns the exposed wax layer parts in the channels 8 are removed. Thus, in the section of FIG. 6 the wax layer 7 is now present only below each strip portion 9.

Figure 7:
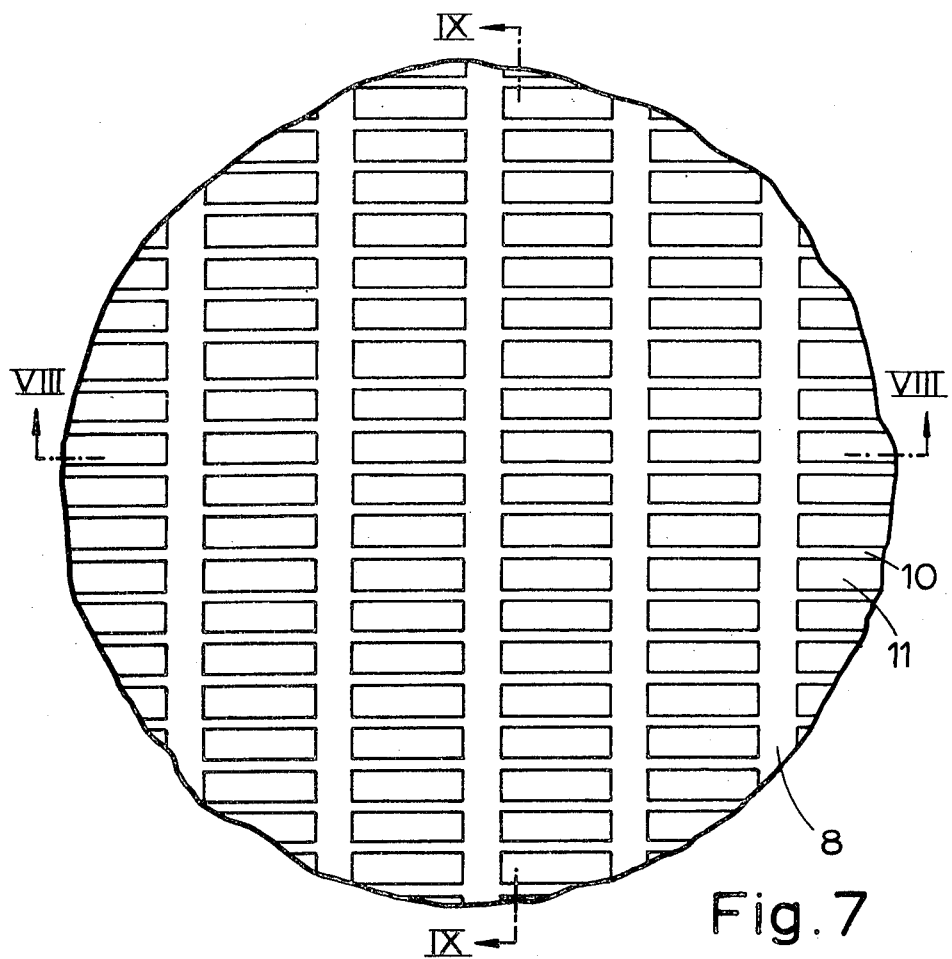
FIG. 7 shows in plan view a portion of the wafer after a further step in the processing.
Figure 8:
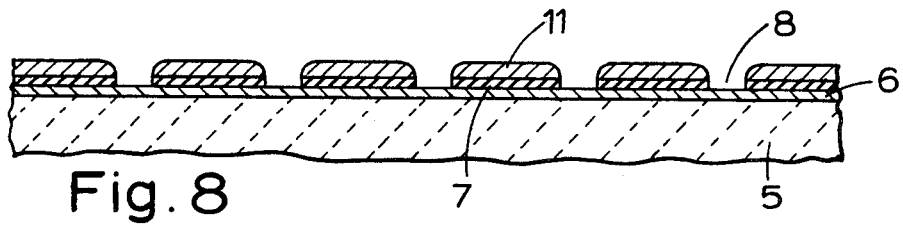
FIGS. 8 and 9 are cross-sectional views taken along the line VIII—VIII and IX—IX respectively of FIG. 7.
Figure 9:
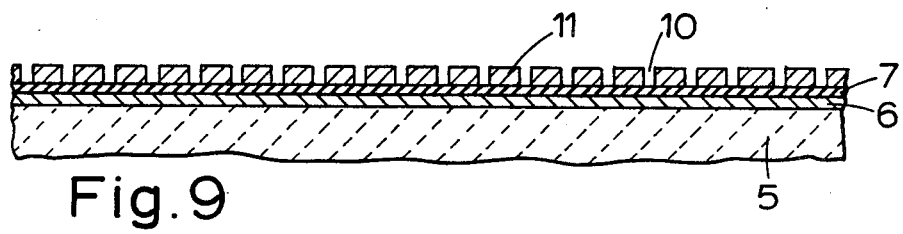

The next stage in the processing is the application of a layer of photoresist on the upper surfaces of the strip portions. Using a conventional photomasking and developing process a plurality of substantially parallel extending strips situated normal to the strip portions 9 are removed from the photoresist layer and etching of the exposed material of the strip portions 9 is effected using a suitable etchant for cadmium mercury telluride to obtain a plurality of substantially parallel extending channels 10 in the wafer material of the strip portions to define on the polishing block an array of substantially rectangular elemental body portions 11 of cadmium mercury telluride. FIG. 7 is a plan view of part of the wafer after forming the channels 10 and thus defining the elemental body portions 11, the remaining parts of the photoresist layer used for the masking having been removed. FIGS. 8 and 9 are cross-sections along the lines VIII—VIII and IX—IX respectively of FIG. 7. FIG. 8 shows the rounding of the edges of the elemental body portions 11 on two opposite sides in contrast to the near vertical edges (FIG. 9) on the other two sides of the elemental body portions. In this example the width of the channels 10 as finally etched is approximately 30 microns and the final surface area of the elemental body portions 11 as shown in FIG. 7 is 200 microns × 50 microns.

Figure 10:
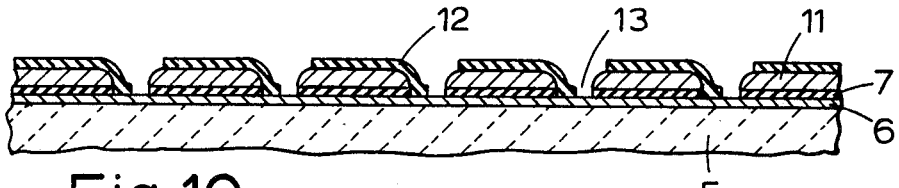
FIGS. 10 to 12 show in cross-section part of the wafer at further stages of the processing.

The next step in the processing is the application of a further layer 12 of photoresist to the surface of the elemental body portions 11 and the exposed surface portions of the wax layer 7 and the tantalum layer 6 on the polishing block 5. By a photomasking and developing step the photoresist layer 12 is defined so that openings 13 (FIG. 10) are formed therein, said openings being in the form of strips of approximately 50 microns width extending parallel to the channels 8 and exposing the elemental body portions 11 at one end thereof at which a rounded edge is present and also exposing the adjoining part of the tantalum layer 6 on the polishing block 5 from which part the wax layer 7 was previously removed in the thickness reduction polishing step. FIG. 10 is a cross-section, corresponding to the section of FIG. 8, showing the photoresist layer 12 and the openings 13 therein.

Figure 11:
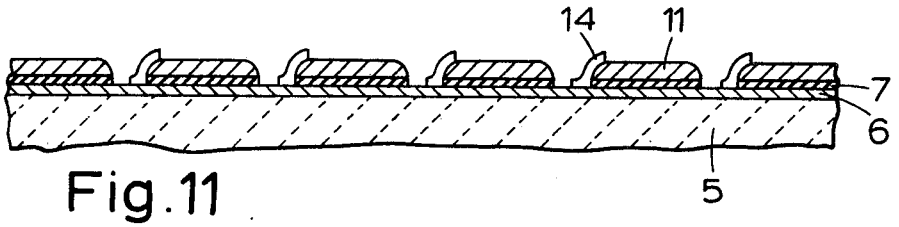

A layer of gold of 0.5 micron thickness is now applied by sputtering. The gold is thus deposited on the photoresist layer 12 and in the openings 13. The photoresist layer 12 is then dissolved in a suitable solvent and the deposited gold thereon is thereby removed by a lift-off technique. FIG. 11 shows a section, corresponding to the section of FIG. 10, with gold layer strips 14 of approximately 50 microns width forming contact between the upper surfaces of the elemental body portions 11 and the tantalum layer 6 on the polishing block 5. The gold layer portions 14 are required to establish this electrical connection for a subsequently effected process because due to the combination of the oxide layer previously provided and located at the lower surfaces of the elemental body portions and the separation of the said body portions from the tantalum layer 6 by the wax layer 7 the elemental body portions 11 would otherwise all be effectively isolated.

Figure 12:
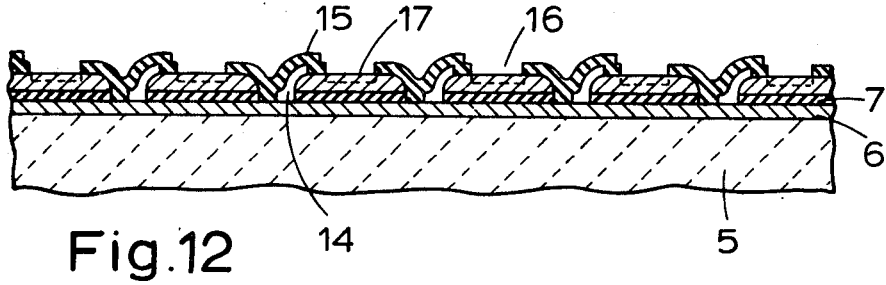

A further layer 15 of photoresist is applied on the upper surface of the assembly and by a photomasking and developing step apertures 16 in the form of rectangular strips of approximately 80 microns width are formed in the photoresist layer 15. FIG. 12 is a cross-section, corresponding to the section of FIG. 11, showing the strip apertures 16 which are located centrally on the surfaces of the elemental body portions 11. These strip apertures 16 have a width in the direction of the larger cross dimensions of the elemental body portions, that is in the direction of the section of FIG. 11, which is slightly larger than the desired final dimension of the active surface areas of the elemental body portions.

In the presence of the defined photoresist layer 15 is exposed surface portions are subjected to a sensitization treatment by etching to remove material over at most 1 micron thickness. There is then effected a passivating treatment. FIG. 12 diagrammatically shows in broken outline a passivating layer 17 produced at the exposed surfaces of the elemental body portions 11.

Figure 13:
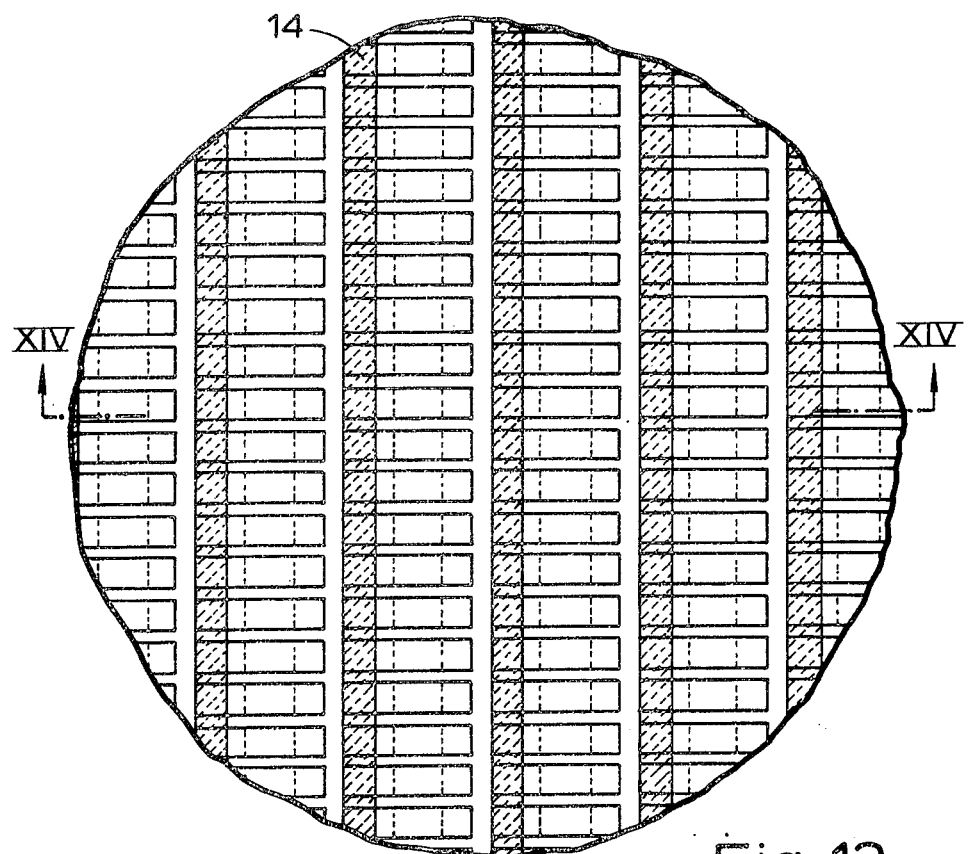
FIGS. 13 and 14 show in cross-section and plan view respectively the same part of the wafer at a further stage in the processing after effecting a passivation treatment, FIG. 14 being a cross-section along the line XIV—XIV in FIG. 13.
Figure 14:
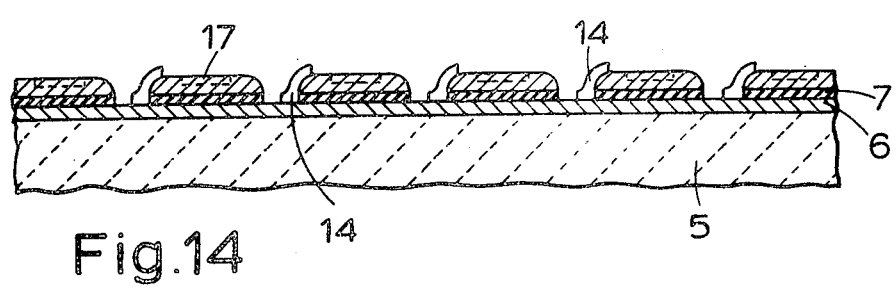

The residual parts of the photoresist layer 15 are now dissolved and FIGS. 13 and 14 respectively show in plan view and section the assembly thus formed with the gold layer strip 14 still present and the elemental body portions 11 having surface parts provided with a passivating layer 17. The gold strips 14 are shown shaded in the plan view of FIG. 13 for clarity of illustration. It is to be noted that as the photoresist layer was removed from parts of the channels 10 between the elemental body portions 11 along the strip apertures 16 parts of the longitudinal side surfaces of the elemental body portions 11 are also exposed to the passivating treatment and the carrying out of this process at this stage, that is after the element definition, can be advantageous in this respect.

Figure 15:
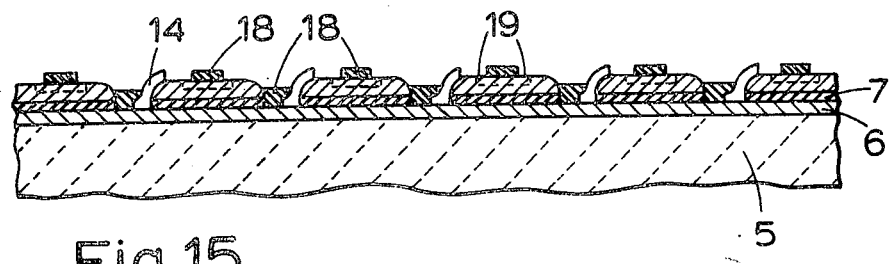
FIGS. 15 and 16 show in cross-section the same part of the wafer at further stages in the processing.

The next step is the application of a further layer of the photoresist 18 followed by a photomasking and developing step for definition of apertures therein. The apertures are formed so that the passivated surface area on each elemental body portion 11 remains covered with the photoresist layer 18 with the exception of a pair of oppositely located peripheral strip parts 19 thereof extending substantially parallel to the curved edges of the elemental body portions 11. The photoresist layer 18 is left remaining in the channels 10 between the elemental body portions and in parts of the channels 8 as shown in FIG. 15 between the elemental body portions it covers the exposed tantalum layer parts and also partly overlaps the gold contact strips 14 where they are present on the tantalum layer 6.

A material removal treatment is now effected at the exposed strip parts 19 of the passivated surface areas in the presence of the defined photoresist layer 18. This is obtained by a polishing process using a lapping cloth and a fine abrasive. It is possible to effect the material removal in this manner because in general the photoresist layer has a greater abrasive resistance than the passivated surface layer and furthermore has a considerably greater thickness. In this manner the passivated surface layer is removed at the exposed strip parts 19 and enables the later application of contact layers to the elemental body portions to be effected without problems of alignment oocurring.

Figure 16:
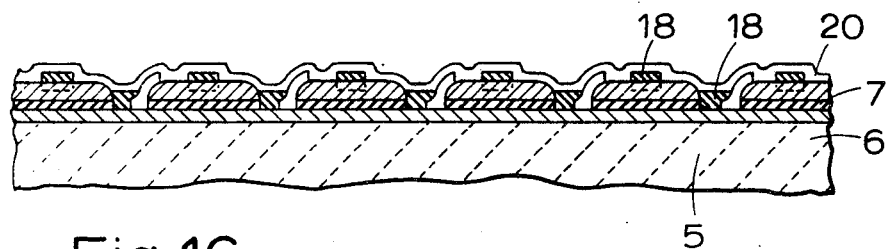

Subsequent to this polishing process a layer 20 of gold of 0.5 micron thickness is deposited on the upper surface of the assembly, including the photoresist layer parts 18 and the exposed surface parts of the elemental body portions 11. The gold is deposited by sputtering and FIG. 16 is a section, corresponding to the section of FIG. 15, showing the gold layer 20 covering the surface of the photoresist layer part 18 and the exposed surface parts of the elemental body portions 11. It is noted that due to the removal of the passivated surface layer along the strip portions 19 (FIG. 15) by a polishing process the gold layer 20 contacts the surfaces of the elemental body portions 11 at no location where there is present any such passivation layer part, that is to say the edges of the gold contact layer 20 are in true registration with the edges of the residual part of the passivated surface layer.

Following the deposition of the gold layer 20 the remaining portions of the photoresist layer 18 are dissolved and the portions of the gold layers 20 thereon are thus removed by a lift-off effect. This leaves on each elemental body portion 11 a pair of gold contact layers 21 and 22 defining therebetween an active surface area of 50 microns × 50 microns. The contact layers 21 extend over the rounded edge at one side of the elements and the contact layers 22 extend in part on the residual portions of the gold strips 14 covering the rounded edge at the other side of the elements. Thus, a certain asymmetry occurs in so far as the contact layer 22 are in part thicker on one side than the contact layers 21 on the other side.

Figure 17:
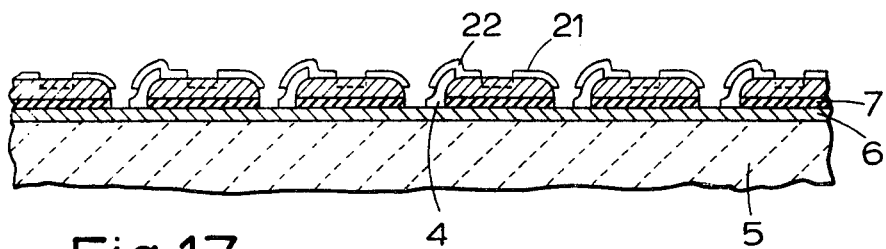
FIGS. 17 and 18 show in cross-section and plan view respectively the same part of the wafer at a stage in the processing after individual elemental body portions of the wafer have been provided with contact layers, FIG. 17 being a cross-section along the line XVII—XVII in FIG. 18.
Figure 18:
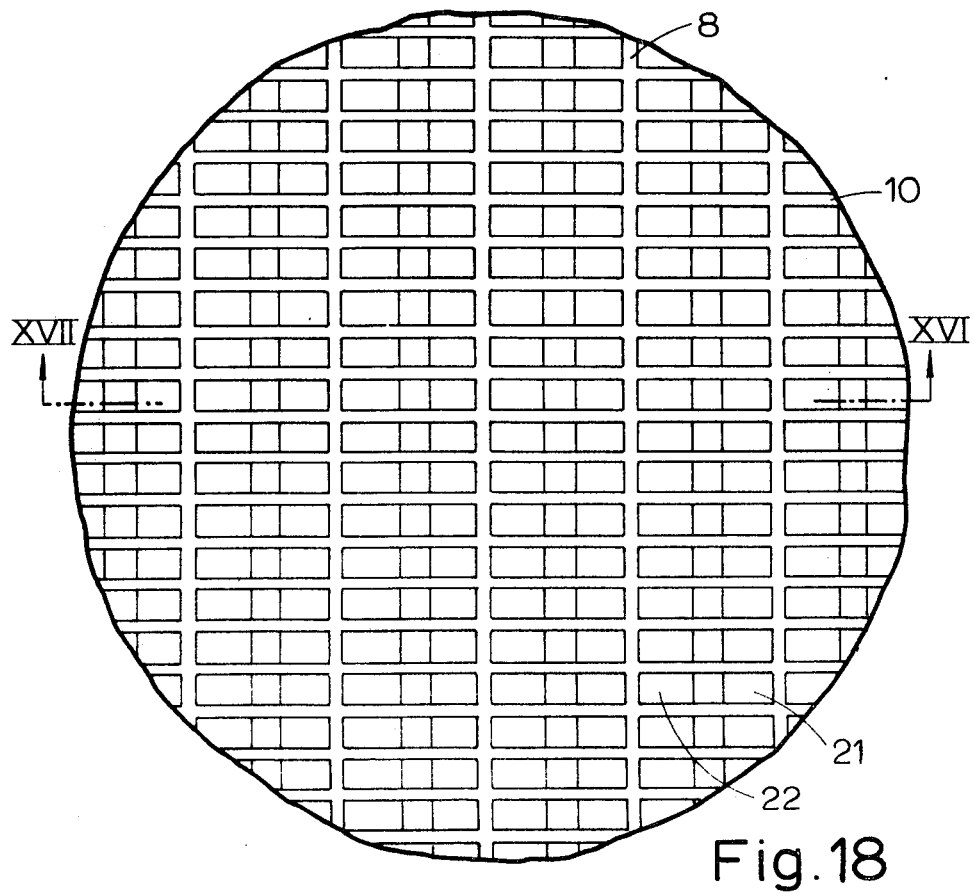

FIGS. 17 and 18 show in cross-section and plan view respectively part of the assembly after dissolving the photoresist layer portions 18. The previously effected rounding of the opposite edges of the elemental body portions over which the contact layers 21 and 22 are provided enables the elemental body portions 11 with said applied contact layers to be employed in the further manufacture of an infra-red detector device in such manner that external electrical contact to the elemental body portions is readily facilitated by a firm deposition process. In this respect reference is invited to our co-pending patent application Ser. No. 705,078, filed July 14, 1976.

At the stage of the processing as shown by FIGS. 17 and 18 there is present a large plurality, in the region of approximately two thousand cadmium mercury telluride elemental body portions 11 with applied contact layers all remaining adhered to the polishing block 5 via the wax layer 7. It will be appreciated that due to the manner of processing, that is starting from a slice cut from an ingot, there may exist some degree of variation in the characteristics of the elemental body portions 11 throughout the whole array as formed. In order to be able to use the elemental body portions 11 effectively without appreciable wastage the next step in the processing is to remove individual elemental body portions 11 from selected positions of the array and subject the elements thus removed to various testing procedures as previously described. In this way a form of 'map' of the elemental characteristics over the whole array can be obtained and this used when selecting one or more of the elemental body portions 11 for removal in the further manufacture of an infra-red detector device. In particular in the manufacture of a multi-element device then a group of adjacently situated elemental body portions in the array on the polishing block will be selected for removal in accordance with the evaluated characteristics of the individual elemental body portions previously removed for testing procedures.

In the present embodiment the elemental body portions 11 are individually removed from the polishing block mechanically by lifting from the wax with the aid of a fine tool.

Figure 19:
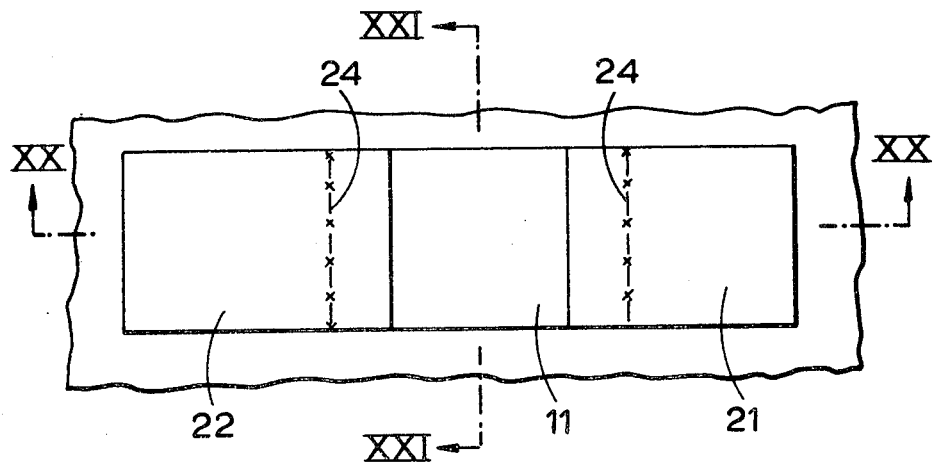
FIG. 19 is an enlarged plan view of one elemental body portion with applied contact layers as present on the polishing block.
Figure 20:
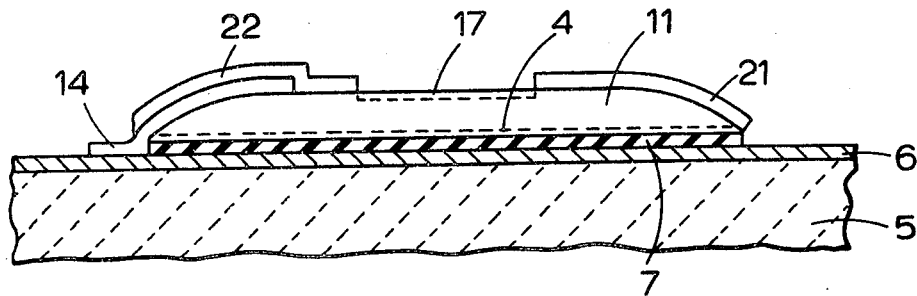
FIGS. 20 and 21 are cross-sectional views taken on the line XX—XX and XXI—XXI resp. of FIG. 19.
Figure 21:
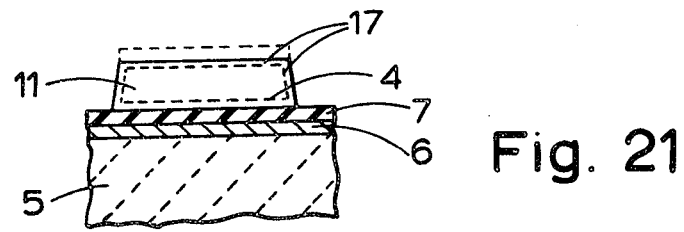

FIG. 19 shows in an enlarged plan view one elemental body portion 11 when still adhered to the polishing block 5 via the wax layer 7 and FIGS. 20 and 21 are cross-sections taken along the line XX—XX and XXI—XXI respectively of FIG. 19. In FIGS. 20 and 21 the passivation layer produced before mounting the wafer on the polishing block 5 is indicated by the broken line 4. The passivation layer produced after the sensitization of the active surface layer after the element definition is indicated by the broken line 17 and from FIG. 21 it is seen that this very thin surface layer is also formed along the adjoining parts of the longitudinal side faces of the elemental body portion 11. The lateral boundaries of the area of the upper surface over which the passivating treatment was carried out are shown by the chain lines 24 in FIG. 19.

From FIG. 20 it is seen that the gold contact layer of 0.5 micron thickness extends over the rounded edge of the elemental body portion 11 on one side thereof. On the rounded edge at the opposite side of the elemental body portion 11 the residual portion of the gold strip 14 of 0.5 micron thickness is present. On this portion of the strip 14 the gold contact layer 22 of 0.5 micron thickness is present, the contact layer 22 further extending in contact with the upper surface of the elemental body portion 11. Thus, on one side of the elemental body portion the composite gold contact layer 14, 22 has a thickness of 1 micron whereas on the other side the gold contact layer has a substantially uniform thickness of 0.5 micron.

It will be appreciated that many modifications are possible within the scope of the invention. For example the method may be applied in the manufacture of infra-red detector elements of other materials, such as indium antimonide. Instead of providing an array as shown in FIG. 17 where all the elemental body portions 11 are of the same size having equal active surface areas the method may be employed to provide from a single starting wafer an array where there are at least two different sizes of the elemental body portions. This can readily be effected at the first photomasking stage when defining the width of the strip portions 9. Although in the embodiment described the method comprises the application of ohmic contact layers to elemental body portions having a uniform material composition and for use in detectors of which the operation is based on the intrinsic photoconductivity, within the scope of the invention there is also a method in which the elemental body portions are formed each having a p-n junction located in the sensitive area and the contact layers extending over the curved edges at the two opposite sides of the sensitive area of an elemental body portion respectively form contact to the p and n-type regions in the elemental body portion.

We claim:

1. A method of manufacturing a plurality of infra-red detector elements each comprising a body of infra-red sensitive material having a substantially rectangular surface configuration with a pair of low resistance electrical contacts spaced apart on one surface of the body at opposite sides of a sensitive area of the element, comprising the steps of adhering a wafer of the infra-red sensitive material to a supporting body, forming a first plurality of substantially parallel extending channels extending in the wafer material to define on the supporting body a plurality of substantially parallel strip portions of the infra-red sensitive material, reducing the thickness of the strip portions to obtain a curvature of the exposed longitudinal edges of the strip portions, forming a second plurality of substantially parallel extending channels in the wafer material of the strip portions in a direction substantially normal to the longitudinal direction of the strip portions to define on the supporting body an array of substantially rectangular elemental body portions of the infra-red sensitive material each having curved edges on two opposite sides, depositing electrically conductive material to form on the surface of each elemental body portion a pair of electrical contact layers which are spaced apart and adjoin the oppositely located curved edges, and removing the elemental body portions with applied contact layers from the supporting body.

2. A method as claimed in claim 1, wherein prior to adhering the wafer of infra-red sensitive material to the supporting body the wafer is subjected to an oxidizing treatment to form an oxide at least on the surface of the wafer which is to be adhered to the supporting body.

3. A method as claimed in claim 2, wherein after adhering the wafer of infra-red sensitive material to the supporting body and prior to the forming the first plurality of channels in the wafer material the wafer is subjected to an initial thickness reduction process via the surface thereof remote from the supporting body.

4. A method as claimed in claim 3, wherein reduction in thickness of the strip portions to obtain a curvature of the exposed longitudinal edges of the strip portions comprises the combination of a polishing process followed by an etching process.

5. A method as claimed in claim 4, wherein subsequent to forming the second plurality of channels in the wafer material exposed surface parts of the elemental body portions are subjected to a passivating treatment.

6. A method as claimed in claim 5, wherein immediately prior to the passivating treatment the exposed surface parts of the elemental body portions are subjected to an etching treatment.

7. A method as claimed in claim 5, wherein the passivating treatment is confined to a central surface of the elemental body portions which areas extend across said elemental body portions, said areas being defined by masking layer portions present on opposite sides of said areas adjacent the curved edges of the elemental body portions.

8. A method as claimed in claim 7, wherein subsequent to the passivating treatment and prior to applying the contact layers the said masking layer portions are removed and a further masking layer is applied and defined so that each passivated surface area is covered by a masking layer portion with the exception of a pair of oppositely located peripheral strip parts thereof extending substantially parallel to the curved edges of the elemental body portions, a material removal treatment being effected at the exposed strip parts of passivated surface areas in the presence of the masking layer portions.

9. A method as claimed in claim 8 wherein said material removal treatment is effected by a polishing process.

10. A method as claimed in claim 9, wherein the further masking layer is of photoresistant and the electrical contact layers are formed by deposition of the electrically conductive material on the exposed surface parts of the elemental body portions and the photoresistant masking layer surface parts followed by the chemical removal of the photoresistant masking layer and the electrically conductive material deposited thereon.

11. A method as claimed in claim 10, wherein subsequent to the application of the contact layers the elemental body portions are removed from the supporting body individually by mechanical means.

12. A method as claimed in claim 11, wherein elemental body portions are removed from selected positions of the array and subjected to testing procedures in order to evaluate the characteristics of the elemental body portions and their distribution in the array.

13. A method as claimed in claim 12, wherein for the manufacture of a multi-element infra-red detector device a group of adjacently situated elemental body portions in the array on the supporting body are selected for removal in accordance with the evaluated characteristics of the elemental body portions removed for the testing procedures.

14. A method as claimed in claim 1, wherein at least the first plurality of substantially parallel extending channels are formed in the wafer with a substantially uniform spacing.

15. A method as claimed in claim 1, wherein the infra-red sensitive material is cadmium mercury telluride.

* * * * *